United States Patent [19]

Mitsuyu et al.

[11] Patent Number: 4,501,987

[45] Date of Patent: Feb. 26, 1985

[54] SURFACE ACOUSTIC WAVE TRANSDUCER USING A SPLIT-FINGER ELECTRODE ON A MULTI-LAYERED SUBSTRATE

[75] Inventors: Tsuneo Mitsuyu, Hirakata; Shusuke Ono, Takatsuki; Ritsuo Inaba, Hirakata; Kiyotaka Wasa, Nara, all of Japan

[73] Assignee: Matsushita Electric Industrial Co., Ltd., Osaka, Japan

[21] Appl. No.: 327,039

[22] Filed: Dec. 3, 1981

[30] Foreign Application Priority Data

Dec. 8, 1980 [JP] Japan .................................. 55-172845

[51] Int. Cl.³ ............................................. H03H 9/25
[52] U.S. Cl. .................. 310/313 A; 333/151; 333/154
[58] Field of Search .......... 310/313 A, 313 B, 313 C, 310/360; 333/151, 154, 194

[56] References Cited

U.S. PATENT DOCUMENTS 3,987,376 10/1976 Kerbel ............................. 310/313 B
4,229,506 10/1980 Nishiyama et al. ................. 428/539
4,247,835 1/1981 Lewis ................................ 333/155
4,354,130 10/1982 Ono et al. ....................... 310/313 A

OTHER PUBLICATIONS

Moulic et al., "SAW Harmonic Responce Cancellation Technique," IBM Tech. Disclosure, vol. 18, No. 2, Jul. 1975.
Matthews, H., Ed., *Surface Wave Filters*, Wiley, NY, 1977, pp. 30-43.

*Primary Examiner*—J. D. Miller
*Assistant Examiner*—D. L. Rebsch
*Attorney, Agent, or Firm*—Wenderoth, Lind & Ponack

[57] ABSTRACT

A surface acoustic wave transducer has a multilayered substrate which is made of a nonpiezoelectric plate which has a surface which is coated with a piezoelectric film, and has an interdigital electrode which is disposed on or under the surface of the piezoelectric film. The interdigital electrode has a split structure and the phase velocity of the surface acoustic wave of the piezoelectric film is smaller than that of the nonpiezoelectric plate.

1 Claim, 8 Drawing Figures

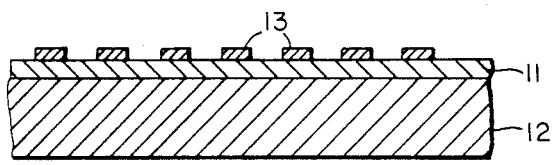
FIG. 1(a).
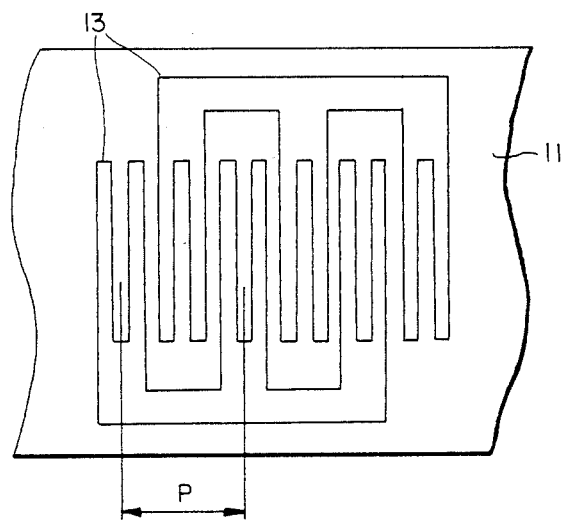
FIG. 1(b).
FIG. 2.
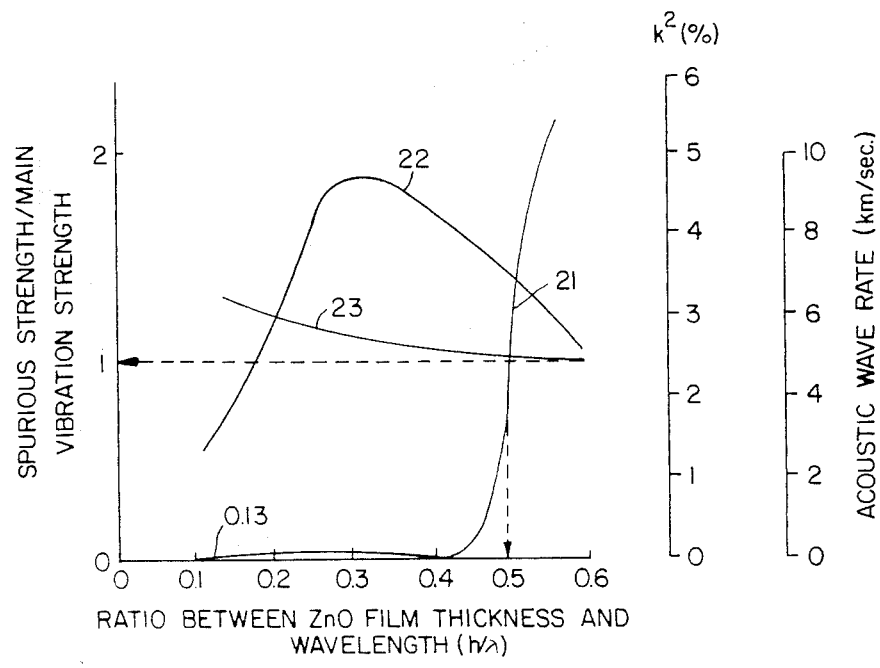

FIG. 5.
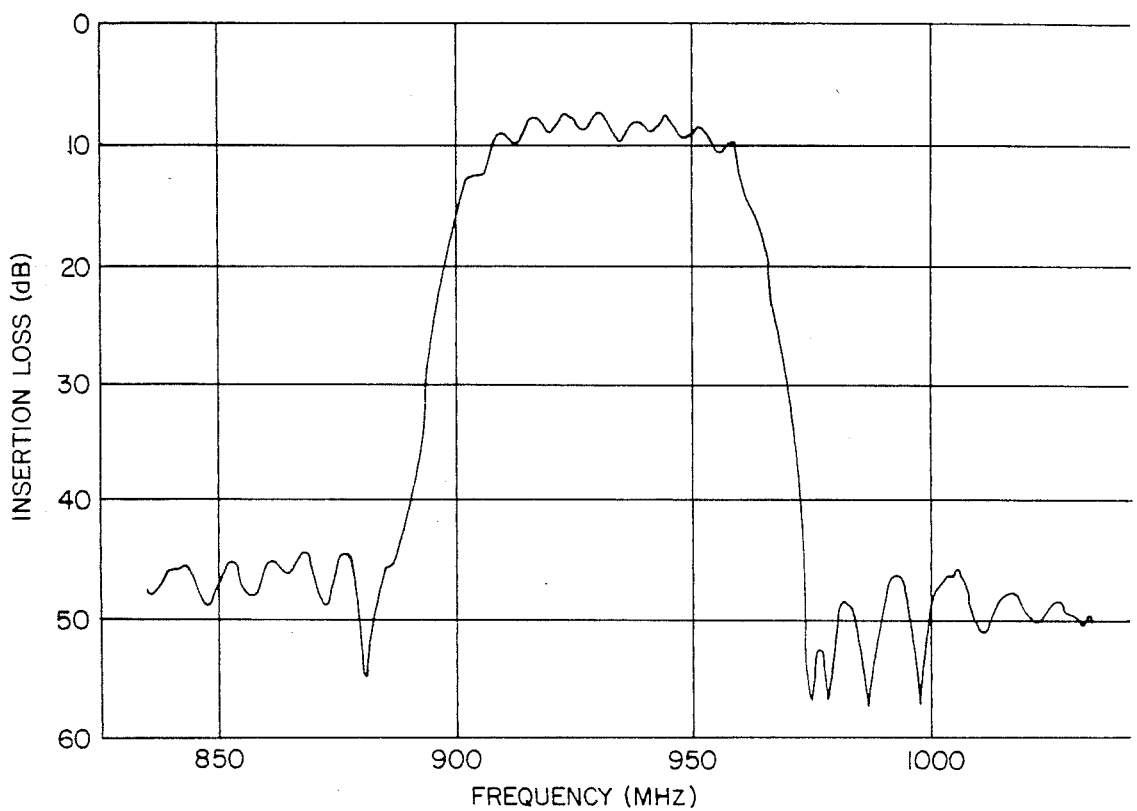
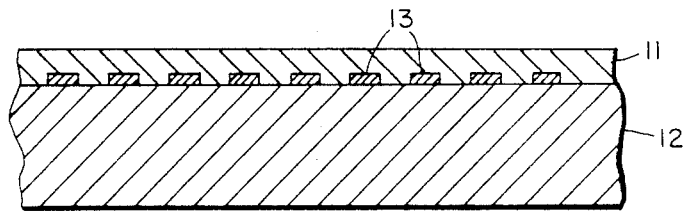
FIG. 6(a).
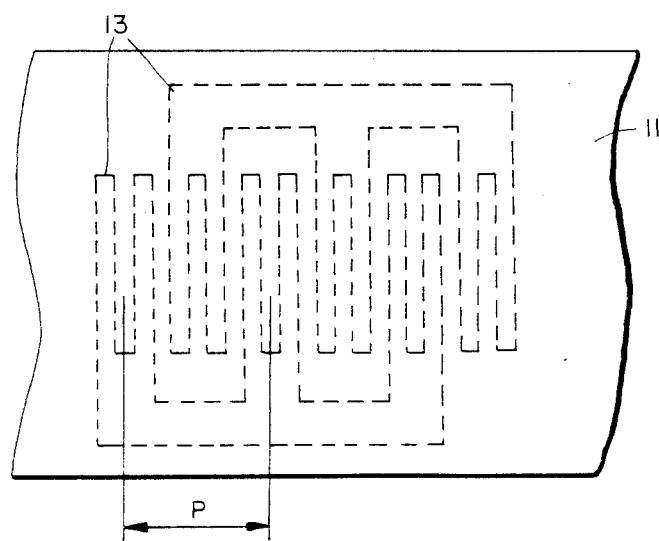
FIG. 6(b).

4,501,987

SURFACE ACOUSTIC WAVE TRANSDUCER USING A SPLIT-FINGER ELECTRODE ON A MULTI-LAYERED SUBSTRATE

BACKGROUND OF THE INVENTION

This invention relates to a surface acoustic transducer.

A surface acoustic wave transducer is formed of comb-shaped electrodes provided on a piezoelectric substrate, the size of the electrode being proportional to a wavelength λ of a surface acoustic wave. The wavelength λ is determined by the equation: λ = v/f, where v is a propagation rate, and f the frequency of the surface acoustic wave transducer. Therefore, when the frequency f is high, the wavelength λ is short, and in turn, the size of the electrode is small, which leads to a lowering of the yield in the manufacturing of such a transducer. It is therefore desirable to use a substrate for the surface acoustic wave transducer which has an acoustic propagation rate which is as high as possible.

Conventionally, the substrate for a surface acoustic wave transducer employs various glass substrates, such as quartz glass, with a film of zinc oxide (ZnO) as a piezoelectric element, in which the acoustic propagation rate is fairly high and in which an effective electromechanical coupling coefficient $K^2$ (which is a basic factor for determining the transducer performance), has not been suitabley obtained. For example, in the case of using a quartz glass substrate having a ZnO film, the acoustic propagation rate v has been about 2.7 km/sec and its coefficient $K^2$ about 3%.

On the other hand, materials having a high acoustic propagation rate include a piezoelectric material such as a film of aluminum nitride, which has a high acoustic propagation rate of 6 km/sec and is easy to process into a comb-shaped electrode, but has a defect in that the preparation of a film of aluminum nitride is difficult.

SUMMARY OF THE INVENTION

The present invention has been designed to eliminate the abovenoted defect. An object of the invention is to provide a surface acoustic wave transducer composed of compound materials having both a high acoustic propagation rate and a large effective electromechanical coefficient, and which is suitable for mass-production, thereby improving its performance in the high frequency zone.

These and other objects of the invention will become more apparent in the detailed description and examples which follow.

BRIEF DESCRIPTION OF THE DRAWINGS

FIGS. 1(a) and 1(b) are respectively sectional and plan views of the principle portion of a surface acoustic wave transducer in accordance with the present invention.

FIGS. 2-4 respectively show the characteristic curves of the surface acoustic waves when a sapphire substrate, and α-alumina substrate, and a silicon substrate are used for the surface acoustic wave transducer in accordance with the present invention.

FIG. 5 illustrates the frequency spectrum of a UHF bandpass filter.

FIGS. 6(a)-6(b) are illustrations for an alternative embodiment of the present invention.

Figure 3:
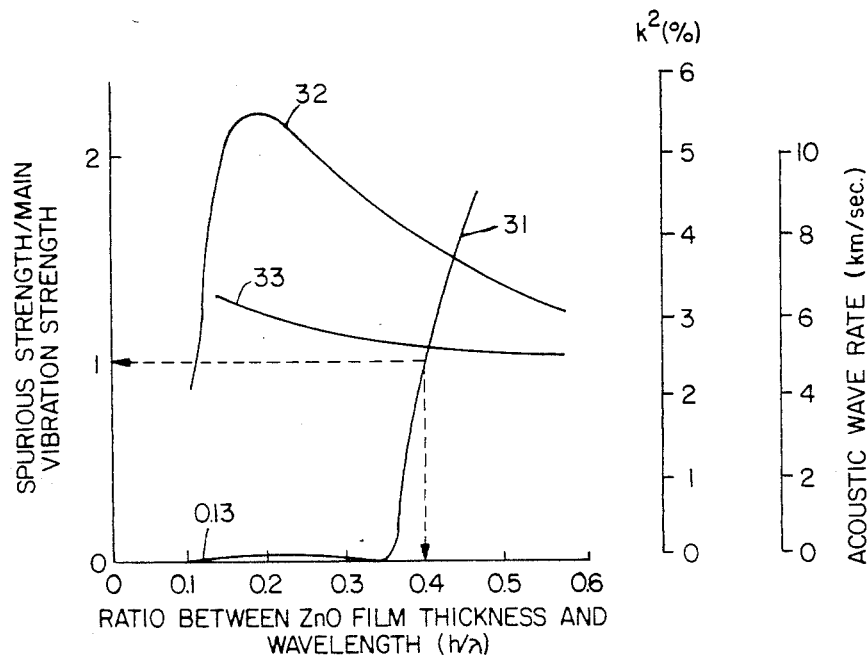

Next, an embodiment of a surface acoustic wave transducer of the present invention will be detailed in accordance with the accompanying drawings.

The surface acoustic wave transducer of the present invention, as shown in FIG. 1(a), is composed of a multilayered substrate comprising a non-piezoelectric substrate 12 which is coated with a piezoelectric film 11 and which has interdigital electrodes 13 affixed to the surface of piezoelectric film 11. The interdigital electrodes 13 are split at regular intervals within the digits and between lines at the comb-shaped electrodes.

The inventors have found that in this kind of multilayered construction, when using a piezoelectric film 11 and a non-piezoelectric substrate 12 such that the surface acoustic wave, e.g., Rayleigh a wave, in the film 11 has a smaller phase velocity than that in the substrate 12, thereby producing a transducer which has a high coupling and produces less unnecessary vibration.

This invention, on a basis of the abovenoted discovery, aims at providing a surface acoustic wave transducer having a high coupling and produces less unnecessary vibration. Such a transducer provides a novel and effective construction of a surface acoustic wave filter for use in the UHF band.

For better understanding of the principle of the invention, an embodiment thereof will be detailed in the following description.

In the FIGS. 1(a)-1(b) construction, the non-piezoelectric substrate 12 employs a (01$\bar{1}$2) face sapphire single crystal plate having a phase velocity of about 6 km/sec with respect to the surface acoustic wave and the piezoelectric film 11 employs a (01$\bar{1}$2) face zinc oxide film formed on the sapphire single crystal plate in epitaxial growth by the use of a CVD process or PVD process and having a phase velocity of about 2.6 km/sec with respect to the surface acoustic wave. In this instance, if the periodicity of the interdigital electrode 13 is represented by P, a surface acoustic wave of a wavelength corresponding to one-third of periodicity P, which is other than that of the usual Rayleigh wave of a wave-length corresponding to periodicity P, is intensely excited, and which has been discovered by the inventors.

The frequency of the intense surface acoustic wave discovered by the inventors is included within a range of three to four times that of the conventional Rayleigh wave. For example, if we assume a thickness of the ZnO film to be h/P=0.1 and the periodicity of interdigital electrode to be 18.4 μm, the novel surface acoustic wave has a frequency of 930 MHz although the conventional Rayleigh wave has a frequency of 280 MHz, which has been confirmed by the inventors.

After considerable research, by changing the thickness of the ZnO piezoelectric film, the inventors have confirmed that vibrations excited in such a configuration include four different modes including the basic Rayleigh wave mode, a tertiary harmonic, a higher Rayleigh wave mode, and a tertiary harmonic of the higher mode, and have also determined that the novel surface acoustic wave is identical with the tertiary harmonic of the higher mode. For example, in the aforesaid embodiment, the basic mode of the Rayleigh wave is 280 MHz, the tertiary harmonic of the basic mode 630 MHz, the higher mode of the Rayleigh wave 377 MHz, and the tertiary harmonic of the higher mode has been discovered by the inventors to be 930 MHz, the tertiary harmonic of the higher mode having a high excited frequency and being effective in the formation of a surface acoustic wave device, e.g., a filter and oscillator, for use in the UHF band. In this case, the three kinds of vibrations, other than the tertiary harmonic of the higher mode, are unnecessary for improving the practicability and will cause spurious vibrations, but the inventors have discovered that restriction of the spurious vibration may be optimized for particular thicknesses and crystallinity of the ZnO film, and for a particular material crystallinity of the non-piezoelectric substrate, thereby enabling the fabrication, on a basis of their discovery, of a transducer having a high coupling and being free from the spurious vibrations.

In other words, the mode of vibration of a device in accordance with the present invention, having a phase velocity in the non-piezoelectric substrate which is larger than that in the piezoelectric film, is effectively excited. For example, when using the ZnO piezoelectric film, an α-alumina, e.g., sapphire or silicon, is optimum for use as the non-piezoelectric substrate. In the case of using an α-alumina, for example, a $(01\bar{1}2)$ face sapphire single crystal is coated with a ZnO piezoelectric film of $(11\bar{2}0)$ face in epitaxial growth by, for example, a sputtering vapour coating, and then interdigital electrodes are formed on the film, thereby producing a transducer of multilayered construction as shown in FIGS. 1(a)-1(b). The interdigital electrodes are aluminum-coated by, for example, vacuum evaporation, the coated film being processed by, for example, photoetching to be constructed to the interdigital electrode. In this instance, the basic mode of the Rayleigh wave in excitation, when the ZnO piezoelectric film is changed in thickness, has a tertiary harmonic which is smaller in strength and affects no generation of spurious vibrations, but the higher mode of the Rayleigh wave is most intensely affected, which has been confirmed by the inventors, who further have found the existence of a range of an optimum thickness of the ZnO film.

The curve 21 in FIG. 2 shows the strength of spurious vibrations in the configuration of $(11\bar{2}0)$ ZnO and $(11\bar{2}0)$ sapphire when the surface acoustic wave is propagated in the direction of, for example, the orientation of ZnO (0001), versus changes in the Z film thickness (represented by a ratio $h/\lambda$ with respect to the wavelength of the excited surface acoustic wave). As noted above, the strength of the vibrations (higher mode), when $h/\lambda$ exceeds 0.5, becomes larger than that of the main vibration (harmonic of higher mode), thereby being not practicable. However, no spurious vibrations occur when $h/\lambda$ is, for example, 0.3 or less than 0.5, and when the ZnO film thickness is further reduced, for example, when $h/\lambda < 0.13$, the higher mode strength will abruptly be reduced so as to excite no mode, whereby the thickness of ZnO film is in the range of: $0.13 < h/\lambda \leq 0.5$. The curve 22 in FIG. 2 represents an electromechanical coupling coefficient ($K^2$, to be hereinafter called the coupling coefficient) of the main vibration of a device in accordance with the present invention, and curve 23 represents its phase velocity so that a substrate having a high phase velocity of 5 km/sec or more and a high coupling coefficient can clearly be compared with a piezoelectric single crystal, e.g., $LiNbO_3$ (with a coupling coefficient of about 5%). On the other hand, a (0001) face of a sapphire crystal is used for the non-piezoelectric substrate so as to allow the ZnO single crystal film to epitaxially grow, and thus a (0001) face ZnO film grows. However, a combination of these orientations does not intensely excite the higher mode of this kind and therefore does not constitute a transducer. The inventors, however, have discovered that the ZnO piezoelectric film, when formed not in a single crystal but as a polycrystalline structure, allows the higher mode to be effectively excited if the film crystal orientation is perpendicular at its C-axis to the non-piezoelectric substrate. Such construction can be obtained by keeping the α-alumina surface in an amorphous condition, the surface being coated with a ZnO film, for example, by use of the sputtering vapour coating. The sputtering vapour coating uses, for example, a sintering target of ZnO and is carried out in a mixed gas of $4 \times 10^{-2}$ Torr of argon and oxygen, in which the coating speed is 0.2 to 0.3 μm/hr. and the temperature of the substrate during the vapour coating is kept at 150° to 180° C. Alternatively, the surface of sapphire single crystal may be coated with an extremely thin quartz film having a thickness of from 100 to 1000 A to form an amorphous layer, so as to thereby be used as the α-alumina substrate. In this instance, it is important to keep the film thickness in a range of $h/\lambda < < 1$ so as not to affect the propagation of the surface acoustic wave.

FIG. 3 shows the characteristic of the higher mode in the multilayered construction of the present invention, in which the surface of a C-axis polycrystalline zinc oxide film is formed in amorphous sapphire and interdigital electrodes are provided on the surface.

The curve 31 in FIG. 3 shows a ratio of strength between the main vibration and the spurious vibration, curve 32 represents the coupling coefficient, and curve 33 represents the phase velocity, in which it is understood from FIG. 3 that the optimum film thickness is in the range of $0.13 < h/\lambda \leq 0.4$. In this case, the higher mode of the main vibration is not excited in a range of $h/\lambda < 0.13$, as in FIG. 2. The ratio of strength between the main vibration and the spurious vibration is 1 at $h/\lambda = 0.4$ and the spurious vibration becomes larger than the main vibration at $h/\lambda > 0.4$, which is not practicable. Referring to FIGS. 2 and 3, $h/\lambda \simeq 0.13$ designates the cutoff point of the higher mode in this type of construction. After considerable reseach, the inventors have confirmed that at $h/\lambda$ above the cutoff point, the higher mode is generated which has a smaller propagation loss, but when $h/\lambda$ is lower than the same point, such a mode has a larger propagation loss so as to become the so-called leaky wave.

In a aforesaid embodiment, the non-piezoelectric substrate of sapphire has been described. Next, a substrate of silicon will be described.

Figure 4:
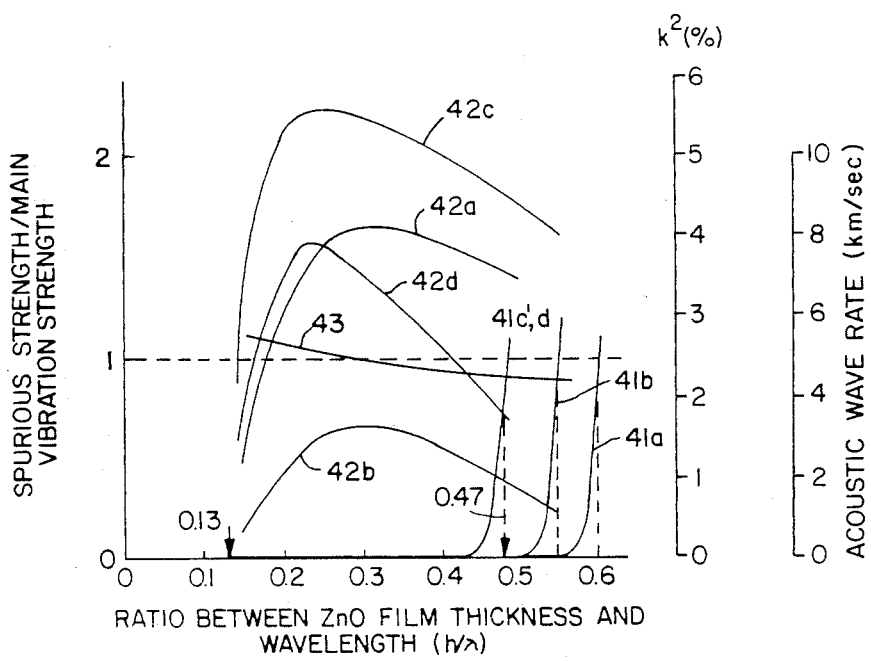

Since the ZnO film is hard to epitaxially grow on a silicon substrate, a ZnO film of C-axis orientation is used as the non-piezoelectric film, the ZnO film of C-axis orientation being formed by sputtering a vapour coating as noted above. The silicon substrate uses a (001) face and a (111) face. The silicon surface is coated with, for example, a quartz film of 100 to 1000 A to an extent of not affecting the propagation characteristics of a surface acoustic wave, namely, in a range of $h/\lambda < < 1$, and thereafter, the ZnO film is sputtering vapor-coated, which demonstrates a larger effect on the electrical insulation strength between a plurality of transducers. FIG. 4 shows the characteristics of a surface acoustic wave of the main vibration of a device in accordance with the present invention when using a silicon substrate, in which the curve 41 shows the spurious vibration strength, curve 42 represents the coupling coefficient, and curve 43a represents the phase velocity. In the same drawing, four kinds of characteristics are shown when the interdigital electrodes are provided on the surface of the ZnO film (in curves 41a and 42a), when provided on the rear surface of the film (in curve 41b and 42b), when the interdigital electrodes are provided on the surface of ZnO film and opposite electrodes are provided on the rear surface, and vice versa. These electrode configurations are formed on a ZnO film of C-axis orientation by means of sputtering vapour coating. In addition, since the ZnO film is usually not epitaxially grown on the interdigital electrodes, e.g., on aluminum-vapour-coated interdigital electrodes, an epitaxial ZnO film is not usable.

As seen from FIG. 4, the electrode construction somewhat changes the excitation strength of spurious vibrations, but in either case, when the thickness of the ZnO film is in the range of from $0.13 < h/\lambda \leq 0.47$, spurious vibration is small enough to be practicable.

FIGS. 6(a)–6(b) illustrate an alternative embodiment of the present invention. The only difference between this embodiment and that of FIGS. 1(a)–1(b) lies in the fact that the interdigital electrodes 13 are formed under rather than over the piezoelectric film 11.

As seen from the above, the transducer of the present invention is effective for use as a transducer for high frequency operation, especially for the formation of a surface acoustic wave filter or oscillator for a high frequency band having low losses and which utilize the characteristics of smaller spurious vibrations and a higher coupling coefficient. For example, in the aforesaid embodiment using a sapphire substrate, the minimum line width of the transducer's electrode is 2.3 μm (where 18.4 μm is the periodicity of the interdigital electrodes) and the working frequency of the transducer is 930 MHz. On the contrary, when a conventional piezoelectric single crystal, e.g., crystal, is used to excite a Rayleigh wave, in order to obtains the working frequency of 930 MHz, the line width of the transducer is in the submicron range of 0.83 μm, thereby being difficult to process with respect to mass-production. The transducer of the present invention, however, has a minimum line width of 1 μm or more and is applicable to the usual photoetching processes and is superior in mass-production productivity.

FIG. 5 shows the characteristics of a frequency spectrum of a UHF band-pass filter using the transducer of the present invention, wherein $(11\bar{2}0)$ ZnO/$(01\bar{1}2)$ sapphire construction is used; the propagation of the surface acoustic wave is: (0001) orientation of ZnO; the ZnO film thickness is: $h/\lambda = 0.228$, and the periodicity $P = 18.4$ μm for the interdigital electrodes.

The above description of the present invention concerns a typical non-piezoelectric substrate of silicon or sapphire. The substrate must be larger in its phase velocity than the piezoelectric film and can be formed of, for example, MgO, AlN, $Si_3N_4$ or SiC, which is effective for respective use with single crystal, ceramics, and glass. Furthermore, the piezoelectric film may use a CdS, ZnS or CdSe film other than the ZnO film when the phase velocity of the surface acoustic wave in such a film is smaller than that of the non-piezoelectric substrate.

As seen from the above, the surface acoustic transducer of the invention is effective for the formation of a UHF band surface acoustic wave device and is widely useful for various radio instruments including UHF band television tuners.

What is claimed is:

1. A surface acoustic wave transducer comprising:
   a multi-layered substrate having a non-piezoelectric substrate composed of one of either sapphire or α-alumina or silicon and having a zinc oxide piezoelectric film deposited directly thereon, the surface acoustic wave of said piezoelectric film having a smaller phase velocity than that of said non-piezoelectric substrate; and
   an interdigital electrode formed on a surface of said piezoelectric film, said interdigital electrode having split-type fingers;
   wherein said non-piezoelectric substrate comprises a $(01\bar{1}2)$ face sapphire crystal, and said piezoelectric film comprises a $(11\bar{2}0)$ face zinc oxide single crystal film, said zinc oxide single crystal film having a thickness h in the range of $0.1 < h/\lambda \leq 0.5$ (where $\lambda$ is a wavelength of said surface acoustic wave);
   whereby said thickness of said piezoelectric film is in a range in which the strength of fundamental response is smaller than that of a harmonic response.

* * * * *